United States Patent [19]

Lampe et al.

[11] 4,041,298

[45] Aug. 9, 1977

[54] FLOATING CLOCK SENSOR FOR BUFFERED, INDEPENDENT, NON-DESTRUCTIVE READOUT OF CHARGE TRANSFER DEVICES

[75] Inventors: Donald R. Lampe, Ellicott City; Marvin H. White, Laurel, both of Md.

[73] Assignee: Westinghouse Electric Corporation, Pittsburgh, Pa.

[21] Appl. No.: 625,697

[22] Filed: Oct. 24, 1975

Related U.S. Application Data

[63] Continuation-in-part of Ser. No. 507,115, Sept. 17, 1974.

[51] Int. Cl.$^2$ ............... G06G 7/12; H03K 5/159
[52] U.S. Cl. ............... 235/193; 307/221 D; 340/173 R; 357/24
[58] Field of Search ............ 235/193; 328/167; 357/24; 250/211 V; 307/221 D; 340/173 R

[56] References Cited

U.S. PATENT DOCUMENTS

| | | | |
|---|---|---|---|
| 3,781,574 | 12/1973 | White et al. | 307/221 D X |
| 3,932,775 | 1/1976 | Kosnocky | 307/221 D X |

Primary Examiner—Joseph F. Ruggiero
Attorney, Agent, or Firm—H. W. Patterson

[57] ABSTRACT

In a charge transfer device (CTD), such as a charge coupled device (CCD), a gate electrode employed for sensing of the charge packet being transferred, or coupled through the device is clocked during one phase of the four-phase clocking and is permitted to float, i.e., be isolated, during a sensing phase of the four-phase clocking. Since the sensor is a gate electrode rather than a diffusion, it presents no obstruction to the propagation of charge down the channel. Since sensing occurs while the electrode is floating, the sensing or readout function does not have any detrimental effect on the propagation of charge down the channel, i.e., it affords a truly non-destructive readout. During a clocking phase in which charge is isolated under a different gate electrode, an attractive voltage clock pulse is applied to the sensor electrode, rendering it attractive. The sensor electrode is then isolated from the clocking source and, in the appropriate succeeding clocking intervals, the charge advances to the well under the sensor electrode. Sensing of the charge then occurs while the electrode remains in its floating condition. Subsequently, a clock pulse is applied to the sensor electrode rendering it repulsive to advance the charge down the CCD channel. The floating clock sensor electrode of this invention is highly advantageous in any application requiring non-destructive readout; an illustrative configuration for non-destructive parallel output (PO) operation of a CCD shift register is disclosed.

16 Claims, 38 Drawing Figures

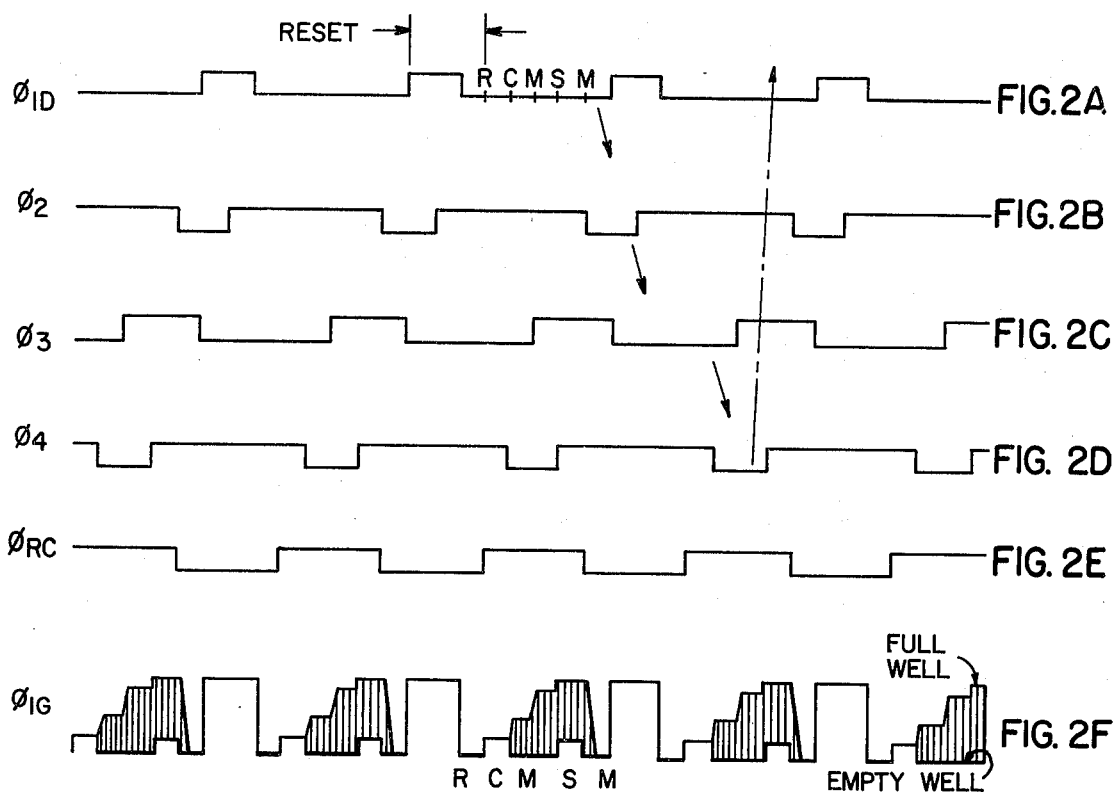
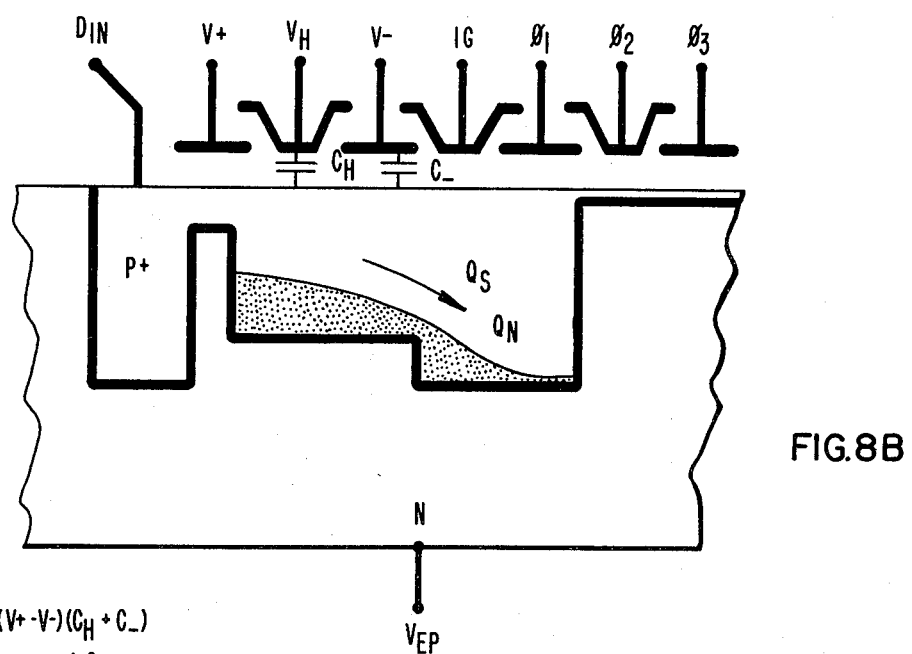
$Q_S = (V+ - V-)(C_H + C_-)$
$Q_N \simeq (kT/C_p)^{1/2} (C_H + C_-)$
$C_P$ = PARASITIC CAPACITANCE ON NODES V+, V-, AND $V_H$ IN SERIES

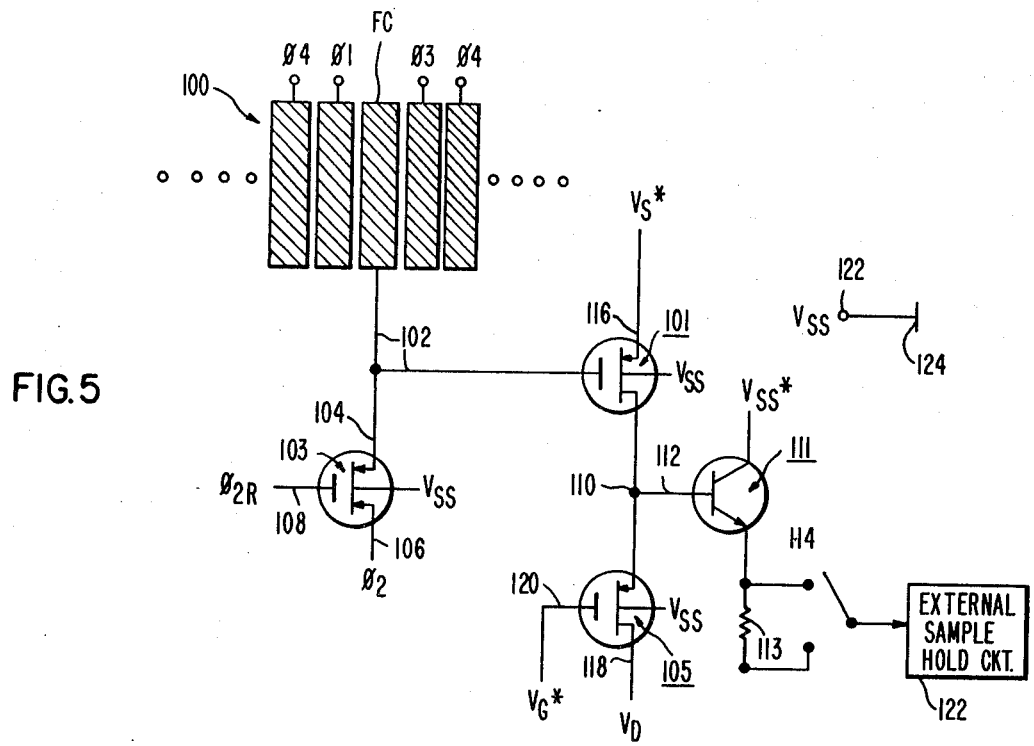
FIG. 5
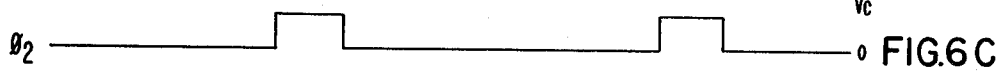

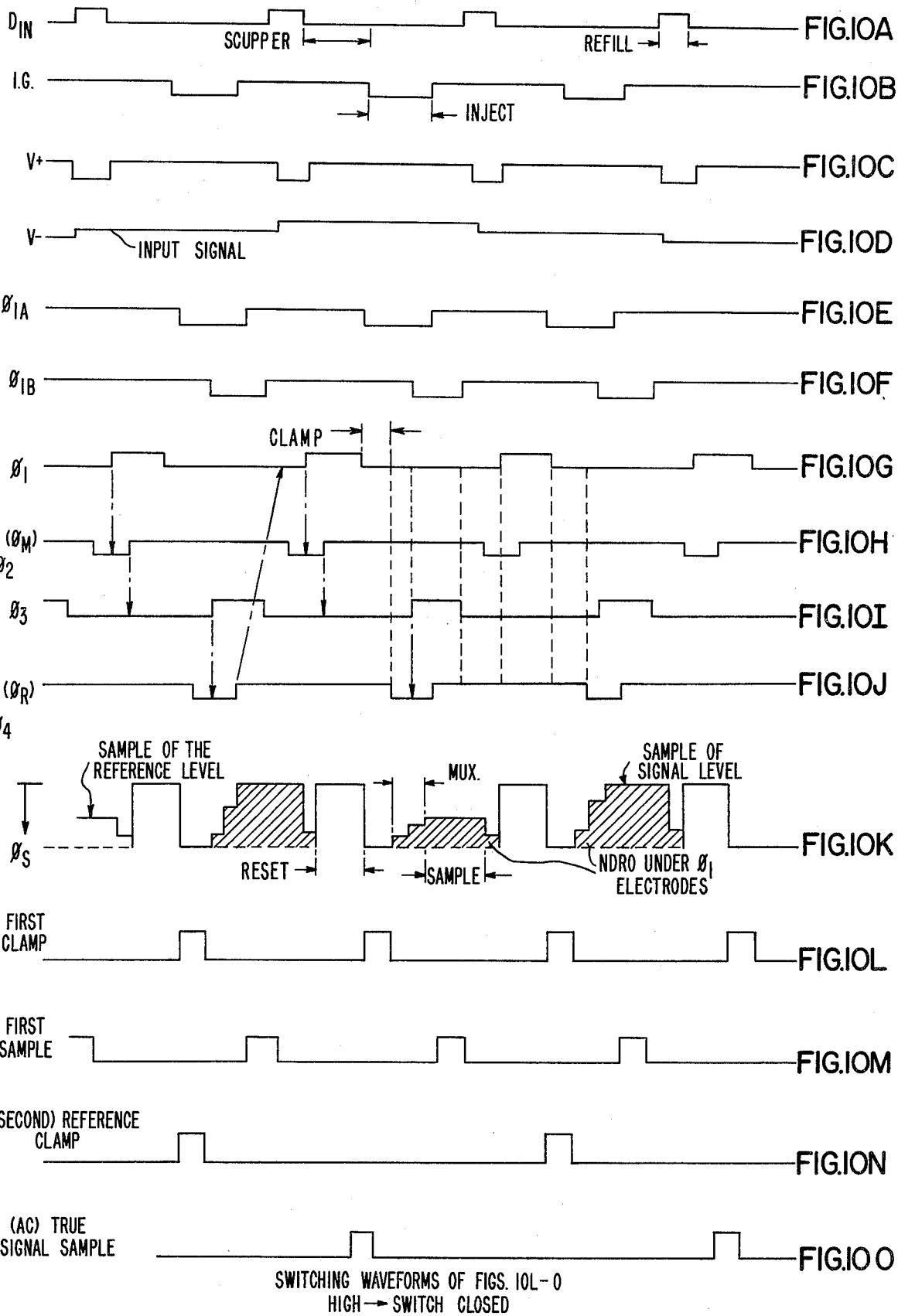

FLOATING CLOCK SENSOR FOR BUFFERED, INDEPENDENT, NON-DESTRUCTIVE READOUT OF CHARGE TRANSFER DEVICES

CROSS-REFERENCE TO RELATED APPLICATIONS

This application is a continuation-in-part of U.S. application Ser. No. 507,115 filed Sept. 17, 1974 entitled A PROGRAMMABLE ANALOG TRANSVERSAL FILTER of Lampe et al, assigned to the common assignee hereof.

BACKGROUND OF THE INVENTION

1. Field of the Invention

This invention relates to charge transfer devices, and more particularly, to a floating clock electrode sensor affording non-destructive signal sensing from a charge transfer device.

2. State of the Prior Art

Charge transfer devices (CTD) including charge coupled devices (CCD) are known in the prior art. In general, charge packets propagate down a CCD channel and at some suitable point are sensed. Sensing may be performed either in a destructive or a non-destructive manner. Since the present invention relates to non-destructive sensing, consideration of only non-destructive prior art sensing techniques is herein set forth.

One technique, typically employed for destructive sensing, is to provide a diffused sensing region at the point of readout from the CCD channel. In some versions, diffused sensing regions have been provided which attempt to afford non-destructive readout. This technique is basically ineffective since there is charge retention on the diffused sensing node which, expressed in terms of inefficient transfer of signal charge from the diffused region, gives rise to considerable signal dispersion.

An isolated floating gate electrode technique has also been employed heretofore in the prior art. Known techniques, however, provide that the gate electrode employed for sensing remain in a floating condition at all times. This has several disadvantages, a principal one being that there is inadequate control over the potential of the isolated floating gate sensor electrode and hence inadequate control of the surface potential in the CCD channel underlying that sensor electrode. Elaborate and complex circuit provisions are required to compensate for this condition, themselves introducing diverse other problems. Non-destructive split-clock-type sensing used in conjunction with preweighted summation over all readouts (tap-points) of a CTD requires gated integration of clock line currents and does not permit independent buffered access to each tap-point.

SUMMARY OF THE INVENTION

Accordingly, it is an object of this invention to provide independent, buffered non-destructive signal sensing from a CTD employing a floating clock sensor electrode.

A more specific object of the invention is to provide non-destructive readout from a CTD wherein the full signal charge value propagating down the CCD channel can be sensed.

Still another object of the invention is to provide a non-destructive readout from a CTD device employing a floating clock sensor which, moreover, is compatible with correlated double sampling techniques.

In accordance with the invention, a "floating clock sensor electrode" is operated, during one portion of the shift, or operating, cycle, as a clock electrode to assure efficient propagation of the signal charge down a CCD channel and is operated as a floating sensor electrode during a different portion of each operating cycle for purposes of sensing, in a non-destructive manner, a full measure of the single charge being propagated. A four-phase clocking scheme may be employed for the CTD. This provides a preferred mode of operation wherein during each shift cycle, the sensor electrode first is driven repulsive to advance the charge packet. The next successive gate electrode then is driven repulsive to continue the advancing of the charge packet and to create a barrier potential. During these functions, the preceding gate electrode has remained repulsive and thus presents a barrier on the opposite side of the sensor electrode. Next, the sensor electrode is reset to an attractive state. In the attractive state, the sensor electrode potential well is isolated by the barrier potentials established by the preceding and succeeding gate electrodes. The sensor electrode then is permitted to float. Appropriate further clocking of the preceding gate electrodes then advances the charge packet into the potential well of the sensor electrode. The preceding gate electrode again is rendered repulsive, assuring that the entire signal charge packet is presented under the sensor electrode, still in its floating potential state. The sensor electrode potential then is sampled to measure the signal output of the CCD. Following the sensing operation, the sensor electrode again is clocked to a repulsive state to advance the charge packet on down the CCD channel.

BRIEF DESCRIPTION OF THE DRAWINGS

FIGS. 2A through 2F are illustrative waveforms related to the operation of the circuit of FIG. 1;

FIG. 5 is a circuit schematic of a preferred form of circuit implementation of the floating clock sensor of the invention, permitting implementation in a monolithic structure and operable in accordance with techniques of CDS and ECDS;

FIGS. 6A through 6E are illustrative waveforms for controlling the system of FIG. 5;

FIGS. 8B and 9A through 9D are illustrative waveforms of potential well conditions in relation to charge injection operations of the charge injector of FIG. 8A; and FIGS. 10A through 10O are waveforms of various control and clocking signals used for control of the system of FIGS. 7A and 7B.

DESCRIPTION OF THE PREFERRED EMBODIMENTS

Figure 1:
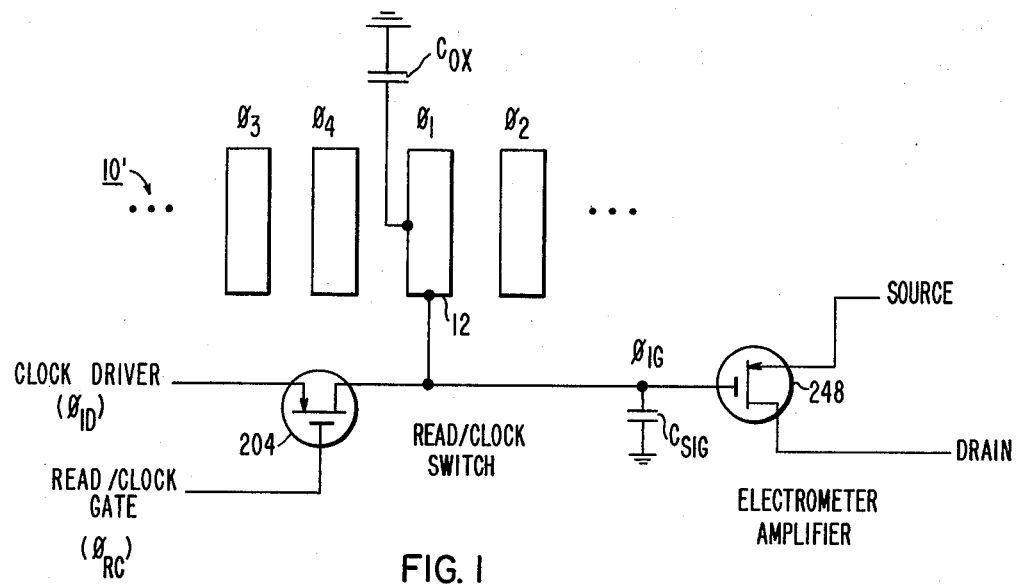
FIG. 1 is a simplified schematic of a floating clock sensor in accordance with the present invention, affording buffered, independent, non-destructive readout of charge transfer devices.

FIG. 1 shows in schematic form at 10' a CCD device having gate electrodes $0_1$ through $0_4$. Gate electrode $0_1$, also labeled 12, functions in different time intervals in each shift cycle both as a clocked electrode and as a floating sensor electrode, providing non-destructive readout of a charge packet propagating down the channel of the CCD 10'. Accordingly, the $0_1$ electrode is termed herein a "floating clock electrode sensor", or, more briefly, the FC electrode. In the embodiment shown in FIG. 1, it is contemplated that parallel outputs from corresponding, other floating clock electrodes will be derived, in accordance with a parallel output (PO) mode of operation of a CCD 10'. Conversely, the floating clock sensor circuitry of the invention may be employed in an equally effective manner for a serial output (SO) mode of operation. In (PO) operation, and considering each group of electrodes $0_1$ to $0_4$ to define a stage of the CCD, the $0_1$ electrode of all, or any desired number, of the successive stages may be employed as the FC electrode. Whereas four-phase clocking is implied in accordance with $0_1$ to $0_4$, and such does afford maximum benefits of the invention, as later detailed, three-phase clocking may be employed with the FC technique of the invention as well. In addition, two or more FC electrodes may be controlled in common by the circuitry shown in FIG. 1, e.g., where unbuffered, internally-summed outputs are to be derived. In the alternative, each FC sensor electrode may be individually provided with a circuit as shown in FIG. 1, thereby providing fully buffered and independent, parallel, non-destructive outputs.

The output of the CCD 10' is derived directly from the $0_1$ electrode and is selectively read out by a read/-clock gate and/or switch illustratively taking the form of a MOS FET 204 whose drain is connected to the floating clock electrode. Signal 01D corresponding to the clock phase signal $0_1$, shown in FIG. 2A, is applied to the source of the clock switch 204, which is controlled by a read/clock signal $0_{RC}$ shown in FIG. 2E. When the read/clock signal $0_{RC}$ goes low, the read/-clock switch 204 is turned on whereby the clock driver $0_{1D}$ is applied to the $0_1$ electrode, 12'; whereas when the read/clock signal $0_{RC}$ goes high, the read/clock switch 204 is turned off and the $0_1$ electrode now floats. A signal voltage $0_{1G}$, represented in FIG. 2F as the charge accumulation in the well beneath the $0_1$ (FC) electrode 12, then is sensed by the floating clock electrode 12 and applied to the gate of the electrometer amplifier, comprising a MOS FET 248.

Figure 3:
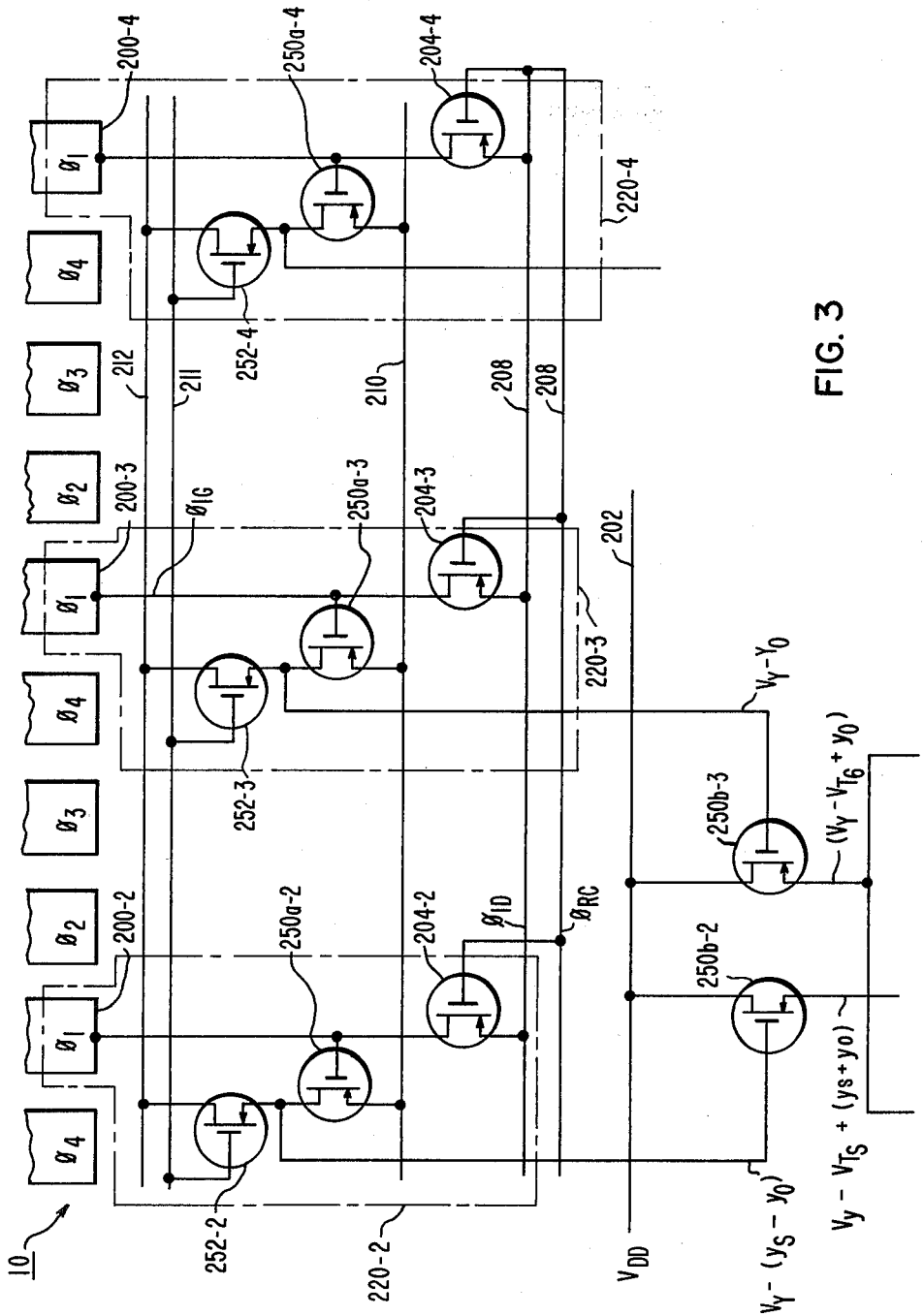
FIG. 3 is a more detailed schematic of a CCD device having plural output circuits operated in accordance with the floating clock sensor techniques of the present invention.

In FIG. 3, there is shown in detail a schematic whereby the signals derived from $0_1$ electrodes 200-2, 200-3 and 200-4 of successive stages of the CCD 10 are selectively read out and applied through corresponding, sensing buffer circuits 220-2, 220-3, and 220-4. In particular, the $0_1$ electrode 200-3 is connected to the sensing buffer circuit 220-3 and in particular to the gate of a sensing buffer amplifier taking the form of A MOS FET 250a-3, whose source is connected to a common source bus 210 and whose drain is connected to the source of a "buffer amplifier load device" taking the form of a MOS FET 252-3, whose gate is connected to a common load device gate bus 211 and whose drain is connected to a common drain bus 212. With the MOS FET 252-3 acting primarily as a load or resistive device, the conductance of the MOS FET 250a-3 is varied in accordance with the voltage applied to its gate as derived from the $0_1$ electrode 200-3, whereby a variable voltage is supplied to the gate of a source follower MOS FET 250b-3. The buffer amplifier load device 252-3 and the sensing buffer amplifier 250a-3 form a unity gain inverter to supply a voltage variable in accordance with the signal $0_{1G}$ induced in the $0_1$ electrode 200-3. Further, the gate of the sensing buffer amplifier 250a-3 is connected selectively by the read/clock switch 204-3 to a driver bus 208, when the read/clock switch 204-3 is rendered conductive in response to the read/clock signal $0_{RC}$, as applied to its gate from a common bus 206. As explained above, when the read/clock switch 204-3 is rendered non-conductive, the signal induced in the now floating, sensor $0_1$ electrode 200-3 controls the voltage as derived from the drain of the sensing buffer amplifier 250a-3. Illustratively, a voltage in the range of −20V to −30V is applied by the bus 212 to the drains of each of the MOS FET's 252, a voltage in the range of −20V to −30V is applied by the common load device gate bus 211 to the gate of the MOS FET's 252, and a DC voltage $V_{BB}$ in the range of 0V to −5v is applied by the common source bus 210 to the sources of each of the MOS FET's 250a. In a similar manner, the buses 208 and 206, respectively, apply the clock driver signal $0_{1D}$ and the clock/read signal $0_{RC}$ to the gate and drain of the MOS FET's 204.

The $0_{1D}$, $0_2$, $0_3$ and $0_4$ signals as shown in FIGS. 2A to 2D are applied to the corresponding electrodes of the CCD 10' as shown in FIG. 3, whereby the charge packet is advanced successively to wells underneath these electrodes, as indicated by the arrows in the FIGS. 2A to 2D. As seen in FIG. 2E, the read/clock signal $0_{RC}$ maintains the read/clock switch 204 conductive whereby the $0_1$ electrode 200 is connected to the clock driver signal $0_{1D}$ for approximately one-half of the $0_{RC}$ low level interval. At the end of the low interval of $0_{RC}$, the $0_1$ electrode 200 is reset in that it is disposed at a potential which establishes as a surface potential receiving well therebeneath for receiving minority carriers. As seen in FIGS. 2A and 2E, the read/clock switch 204 is rendered conductive as the read/clock signal $0_{RC}$ goes low; during this period, the drive signal $0_{1D}$ goes high, thereby repulsing charge carriers from beneath the $0_1$ electrode 200 to provide an essentially open, i.e., empty, well at the end of the reset period. When the read/clock switch 204 opens, the $0_1$ electrode "floats", assuming a potential corresponding to the charge that gradually builds up therein as indicated in FIG. 2F. in particular, the $0_1$ electrodes 200 becomes a high impedance node which has been reset to a predetermined potential, a measure of which is clamped during the interval C in FIG. 2F on another capacitor for reference later in the cycle. As indicated in FIGS. 2A and 2D, the propagation action of charges through the well beneath the $0_1$, $0_2$, $0_3$ and $0_4$ electrodes then gates or muxes, indicated by M in FIG. 2F, the charge packet into the surface potential receiving depletion region underneath the $0_1$ electrode 200. In general, most of the read/clock signal voltage appears across the $0_1$ electrode. The build-up of charges as indicated in FIG. 2F proceeds cylically through the steps of resetting, clamping, charge advance or muxing, and sampling, explained in some detail above.

Each buffer circuit 220 converts the high impedance of its corresponding $0_1$ electrode 200 to a relatively low impedance at its output, i.e., the drain of the sensing buffer amplifier 250a. Illustratively, the impedance is reduced by the circuit 220 from a value in the order of 100K ohms to 50K ohms. To further reduce the $0_1$ electrode impedance, the output of each buffer circuit 220 is supplied to its corresponding source follower MOS FET 250b, whose drain is coupled by a common bus 202 to a reference voltage $V_{DD}$, while its source provides an output. In particular, each MOS FET 250b further reduces the impedance from a value in the order of 10K to approximately 1K. As shown in FIG. 3, the output of the buffer circuit 220-2, similar to the buffer circuit 220-3, is applied to the gate of the source follower MOS FET 250b-2, which serves a similar function to that of source follower MOS FET 250b-3, i.e., further reducing the output impedance. Thus, the buffer circuits 220 and the MOS FET's 250b form a two-stage impedance reduction before a signal, indicative of the charge packet stored in the wells beneath the $0_1$ electrodes 200-2 and 200-3, is applied to the outputs.

Figure 4:
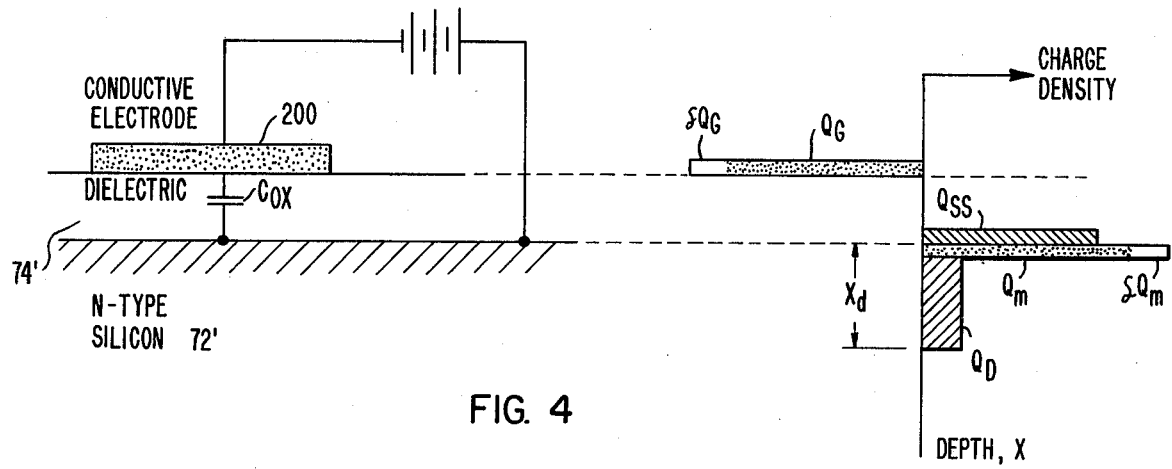
FIG. 4 is an illustrative cross-section of a CCD device as in FIG. 3 for explaining charge conditions existing within the device.

FIG. 4 shows schematically, a cross section of CCD 10', having an N-type silicon layer 72' covered by a dielectric 74', and in which various charges are built up in accordance with the following equations:

1. $Q_G + Q_{SS} + Q_S = 0$
where
2. $Q_G =$
   $C_{OX}V_{OX}$ = charge on conductive gate
   $C_{OX}$ = Oxide capacitance under gate
   $V_{OX}$ = Potential energy drop through the oxide,
3. $Q_{SS}$ = charge trapped at oxide/silicon interface, and
4. $Q_S = Q_D + Q_M$, with
5. $Q_D + -q\ N_D X_d$, $N_D$ + donor concentration,
6. $X_d = (2k_s\epsilon_o 0_s/qN_D)^{\frac{1}{2}}$ = depletion depth, and
   $0_S$ = silicon surface potential,
   $Q_M$ = mobile minority charge carriers Combining equations (5) and (6) gives us $$\frac{Q_D}{C_{OX}} = -\sqrt{2\frac{K_s\epsilon_q N_D}{C_{ox}}\phi_s} = 1(2V^*\phi_s)^{\frac{1}{2}} \text{ where} \quad (7)$$

$$V_* = \frac{K_s\epsilon_q N_D}{C_{ox}}. \quad (8)$$

Summation of the potential energies yields
(9) $V_G = 0_1$ gate potential $= V_{ox} + 0_s + 0_{mx}(0_{ms} =$ metal-semiconductor work-function difference)

Temporarily, we assume that $V_G$ is a voltage source like a battery; so that differentiation yields:
10. $\delta V_g + 0 + \delta V\sigma_x + \delta\sigma_x$.
But from equation (2), $\delta Q_G$ = displacement charge $-C_{ox}\cdot(\delta V_{ox})$ or
11. $\delta Q_G = -C_{ox}\cdot\delta 0_s$.
Combining (1), (2), (4) and (7) gives:
12. $C_{ox}V_{ox} + Q_{SS} + Q_M - C_{ox}(2V\cdot 0_s)^{\frac{1}{2}} = 0$
Substituting equation (9):
13. $0_s + (2V\cdot 0_s)^{\frac{1}{2}} = V_G = 0_{MS} + (Q_{SS}+Q_M)/C_{ox}$.
Differentiating:

$$\delta\phi_s = \delta Q_M/C_{ox}\cdot\left[1+\left(\frac{V_*}{2\phi_s}\right)^{\frac{1}{2}}\right] \quad (14)$$

where $\delta Q_m$ = incremental signal charges injected into depletion region. Finally, (11) and (14) are combined to give:

$$\delta Q_G = \text{displacement charge} = -\left[1+\left(\frac{V_*}{2\phi_s}\right)^{\frac{1}{2}}\right]^{-1}\delta Q_m \quad (15)$$

Typically $|V_*| \simeq 0.1$ to 0.2V, while $5 \leq |0_s| \geq 20$V, so that

(16) $\delta Q_G$ = displacement charge $\simeq -\delta Q_M$ = signal charge. But in the case when the battery is disconnected (as after reset), the only source of displacement charge is the combination of all other capacitances at the amplifier gate node, $C_{SIG}$:

17 $\delta Q_G = -C_{SIG}\cdot\delta V_G$
Combining (9) and (17) gives:

$$-\frac{\delta Q_G}{C_{SIG}} = \delta V_{ox} + \delta\phi_s, \quad (18)$$

into which we substitute (2):

$$\delta Q_G = \frac{-C_{SIG}\cdot C_{ox}}{C_{SIG} + C_{ox}}\cdot\delta\phi_s \quad (19)$$

Finally, this is combined with (14) to yield:

$$\left|\begin{array}{c} \delta Q_G \simeq \dfrac{-C_{SIG}}{C_{SIG}+C_{ox}}\cdot\delta Q_m \\ \delta V_G = \dfrac{-\delta Q_m}{C_{SIG}+C_{ox}} \end{array}\right| \text{ or} \quad (20)$$

Equation (20) describes the potential appearing at the gate of the sensing buffer amplifier 250a, whose waveform is shown in FIG. 2F. After the signal corresponding to this charge has been advanced into the potential well underneath the $0_1$ electrode 200 and the adjacent potential barriers re-established, the signal is sampled as indicated by S in FIGS. 2B and 2G and differenced against the previously-stored reference reset level to cancel any reset noise in a manner similar to that explained above. Next, the signal packet is transferred to the next, successive cell with the read/clock switch 204 rendered conductive to apply the driver signal $0_{1D}$ to the $0_1$ electrode 20.

The subject floating clock electrode technique is fully compatible with an error correcting technique characterized as extended correlated double sampling and itself the subject matter of a copending application Ser. No. 625,694 filed concurrently of Lampe et al and entitled EXTENDED CORRELATED DOUBLE SAMPLING FOR CHARGE TRANSFER DEVICES, that application being a continuation-in-part of the parent application common hereto. Extended correlated double sample (ECDS) is an important technique since it provides compensation for errors in the output signals of a CTD arising due to drifting of bias sources, and leakage current and threshold non-uniformities. Hence, the desired linearity and accuracy of the output is greatly enhanced through the ECDS technique.

Incorporation of ECDS techniques with the floating clock sensor of the present application is highly desirable, the combination of these techniques contributing greatly to improvement in the accuracy of the output signals from a CCD (CTD) device. In general, the present invention finds application in any form of charge signal sensing, whether for serial output (SO) or parallel output (PO) sensing.

FIG. 5 is a circuit schematic of a preferred form of control circuitry for use in association with the floating clock sensor electrode technique of the present invention. The circuit operation is described hereinafter. Of significance to CCD technology is that the transistor elements shown in FIG. 5 may be implemented in a monolithic structure. By contrast to the circuit of FIG. 1 employing MOS transistors, only, FIG. 5 employs a vertical bipolar transistor 111 operated as an emitter-follower, and which may be fabricated above with MOS transistors 101, 103and 105 in an epitaxial layer common to the CCD 100. Note that transistors 101 and 105 are connected as an inverter, a basic component building block of I²L technology. The inverter configuration of transistors 101 and 105 may be altered to a source follower arrangement by the simple expedient of reversing the bias as between nodes 118 and 116 and connecting gate 120, for example, to substrate potential. This source follower configuration may be employed in the alternative to the inverter configuration in the circuit of FIG. 5. Such monolithic structures and a process for such fabrication thereof is the subject matter of the concurrently filed patent application Ser. No. 625,719 of Lampe et al, entitled MONOLITHIC SEMICONDUCTOR STRUCTURE AND PROCESSING TECHNIQUE FOR PROVIDING A STRUCTURE HAVING PLURAL DIFFERENT TYPES OF SOLID STATE DEVICES, assigned to the common assignee hereof.

The circuit schematic portion of FIG. 5 provides the clamped and sampled outputs on the sensor electrode FC to an external sample and hold circuit 122, the latter containing the necessary circuit provisions for achieving both CDS and ECDS (a specific schematic disclosing these functions being shown in FIGS. 7A and 7B and discussed hereinafter).

In FIG. 5, CCD 100 includes a plurality of successive gate electrodes individually labeled ... $0_4$, $0_1$, FC, $0_3$, and $0_4$; FC corresponds to a $0_2$ electrode. $0_1$, $0_3$ and $0_4$, accordingly, are the remaining three of the four clock phases used to drive the CCD. Data propagating down the CCD channel in accordance with the four phase clocking may be read out non-destructively by sampling the voltage induced on the FC electrode when the charge packet has advance, or shifted, to be confined in the potential well associated with the FC electrode. As is known, the charge transfer into the well has the effect of a charge redistribution in a capacitor system, inducing a voltage in the FC electrode. In general, the propagation of data through a CCD and the operation of such a device by four-phase clocking is well known. (See for example IEEE Journal of Solid-State Circuits, Special Issue, October 1975, "A Non-Volatile Charge-Addressed Memory (Novcam) Cell" by M.H. White, D.R. Lampe, J.L. Fagan, Francis C. Kub, and D.A. Barth, page 281 et seq. (especially the discussion at page 285).

The circuit associated with the floating clock electrode FC includes a transistor 103 operating a clock reset switch, transistors 101 and 105 which, taken together, comprise a unity gain inverter, and transistor 111 comprising a vertical, bipolar, emitter-follower.

The operation of the circuit of FIG. 5 will be more readily appreciated with respect to the waveforms of FIGS. 6A through 6E. (High levels are repulsive and low levels are attractive to the charge carriers of the illustrative CCD 100.) During the reset interval defined by 02R in FIG. 6B, transistor 103 conducts to couple 02 to the floating clock electrode FC, first driving it repulsive (i.e., while high) to force charge toward the 03 electrode. Next, as seen in FIG. 6D, 03 becomes repulsive to put a barrier in front of the 02 (FC) electrode. Then 02 goes attractive, followed by the opening of the reset switch (transistor 103) upon 02R going high. The charge packet, however, is at this time confined in the 04 electrode well, by 01 and 03 each being repulsive. The FC electrode well thus receives no charge, although attractive. 02R then terminates, concluding the reset interval and initiating the clamp interval, during which the attractive voltage of the FC electrode, representing the empty FC electrode well, is applied to the gate of the MOS amplifier 101; this level is clamped (stored) in the external sample/hold circuitry 122. Next, in "push-clock" fashion, $0_1$ goes attractive "muxing", or gating, the signal charge into the $0_2$ well followed by successive pusehs of $0_4$ and $0_1$ going repulsive (i.e., the mux interval). At this time, both the $0_1$ and $0_3$ electrodes are high and therefore repulsive; as a result, the charge packet is stored in the FC electrode well, the FC electrode having remained attractive, although in a floating state, from the reset interval. Note, moreover, that 02R remains high, and hence the transistor switch 103 remains off, and $0_2$ is not coupled to the FC electrode. The sample interval thus initiates with $0_1$ going high, and terminates with $0_3$ becoming attractive, at which time charge begins to flow from the FC ($0_2$) electrode well to the $0_3$ electrode well. The sample interval, accordingly, is the time when the signal from the FC electrode is sampled in the external sample/hold circuitry 122.

The external sample and hold circuit 122 typically is connected to receive the output current from the resistor 113 — that the output current being a function of the voltage of the emitter output 144 of transistor 111 times the conductance of the resistor 113. Alternatively, a read-out may be obtained from the output terminal label $v_o$ connected directly tpo the emitter 114. The sample and hold circuit 122 then compares the sensed signal with the previously stored clamped value of the FC electrode and determines the difference.

The differencing function, briefly noted above, is known in the art as "correlated double sampling" (CDS) and corresponds to the teachings of U.S. Pat. 3,781,574 hereinabove cited. As disclosed in more detail in that patent, the sampling function introduces so-called "Nyquist noise" in the output signal. This is an inherent result of sampling of an analog signal. The sample and hold, plus differencing function of the circuit of FIG. 5 briefly alluded to above, serves in accordance wtih the teachings of the cited patent to correct for that source of noise. Particularly, it will be appreciated that the clamp operation is an inherent, or a necessary, function of the basic circuit as in FIG. 5. The clamp operation, however, may be utilized to advantage in accordance with the technique of CDS.

Particularly, the clamp operation is a sampling function just as the "sample" interval in which a sample of the signal voltage on the electrode FC is taken for generating the sensed output voltage corresponding to the charge packet confined under the FC electrode. Nyquist noise of corresponding amount, accordingly, is generated by each of the clamp and sample operations. Accordingly, the sample and hold of the clamp voltage level and the subsequent differencing of the clamp and sample voltage provides for cancellation of the Nyquist noise component from the sample signal voltage.

As previously noted, the floating clock electrode sensor of the present invention desirably is implemented with circuitry providing extended correlated double sampling (ECDS). FIGS. 7A and 7B hereof show in combined block diagram and circuit schematic form, a system for performing both ECDS and CDS in a P/O CCD shift register configuration. FIG. 8A is a schematic cross-section of the stabilize charge injector 12 and is discussed in connection with the potential well waveforms of FIG. 8B and FIGS. 9A and 9D. The operation of the circuit of FIGS. 7A and 7B and of the stabilized charge injector then is discussed in relation to the waveform of FIGS. 10A through 10O.

Figure 7A:
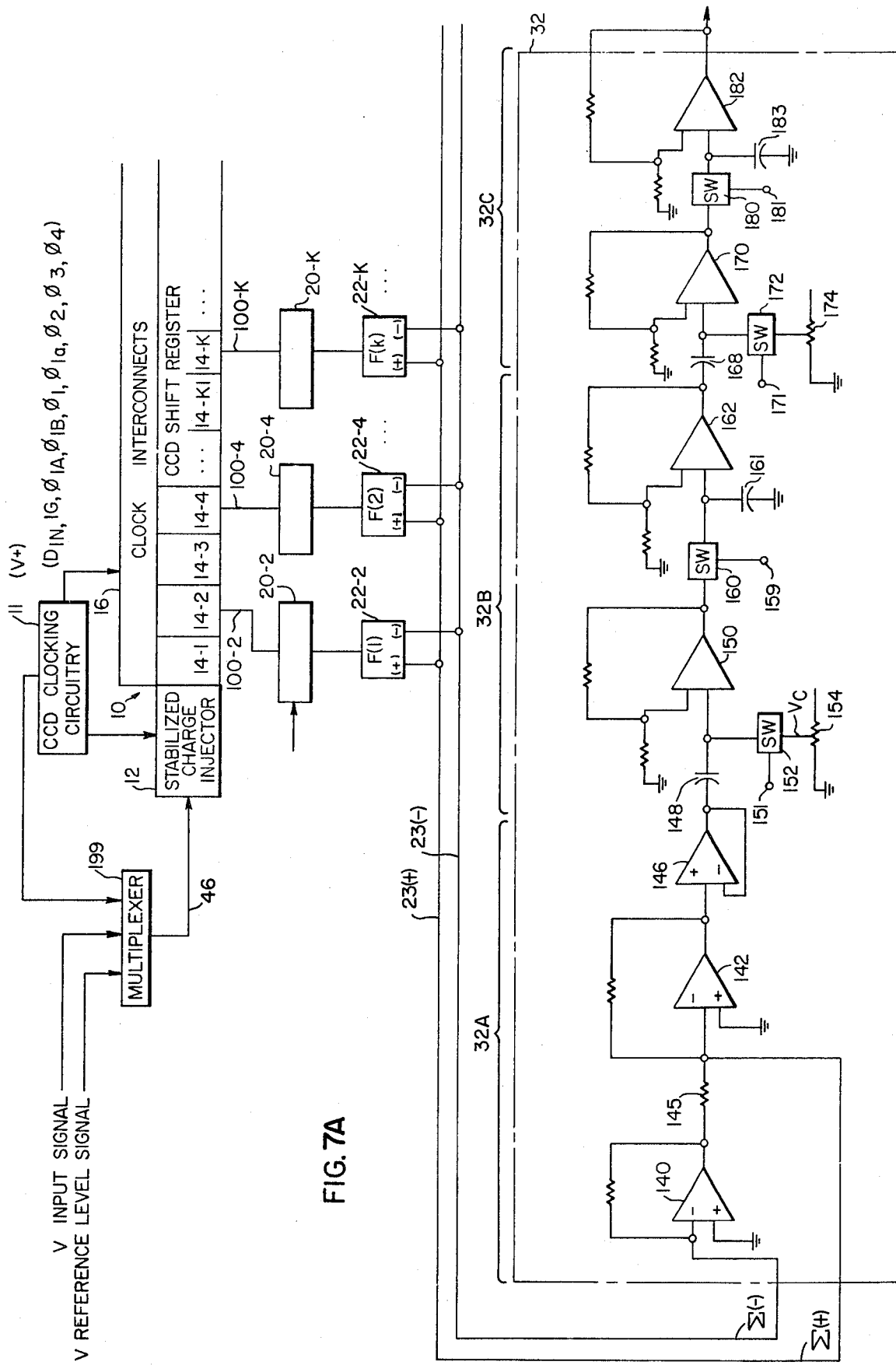
FIGS. 7A and 7B are more detailed schematics, partly in block diagram form, of a CCD device having parallel readout from the CCD and utilizing the floating clock sensor of the present invention and performing ECDS and CDS therewith.
Figure 8A:
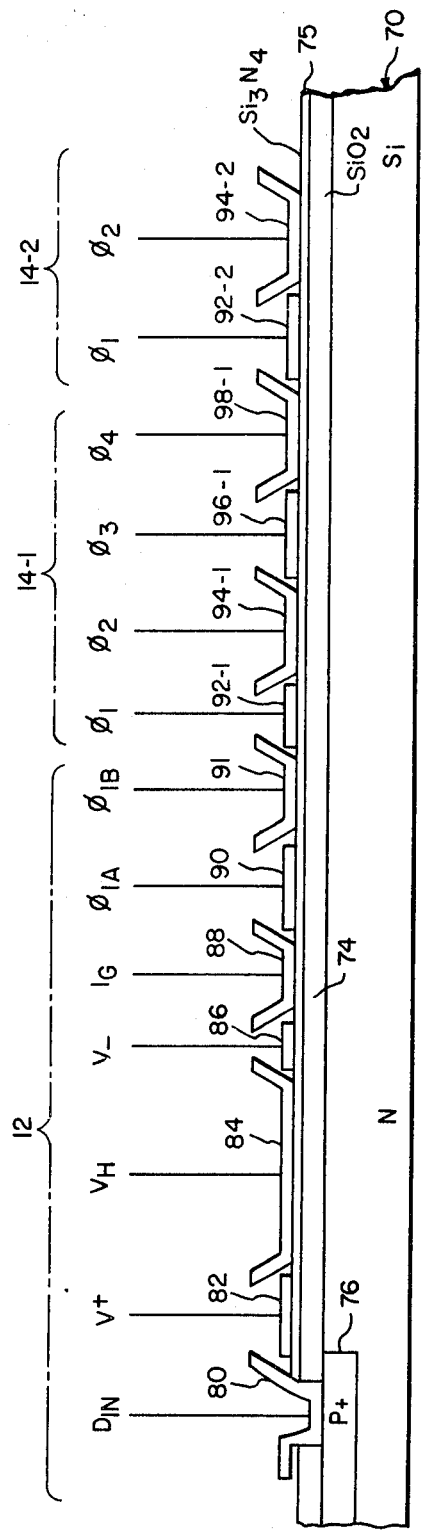
FIG. 8A is an illustrative cross-section of a charge injector circuit as employed in the system of FIG. 7A.

FIG. 7A of the drawings illustrates in schematic form a discrete analog processing system in accordance with the teachings of this invention and comprising a charge transfer device illustratively taking the form of a charge coupled device 10 (CCD) and including a stabilized charge injector 12 for injecting the input signal charges into the CCD 10. A CCD master clock circuit 11 provides suitable clock signals for operation of the injector 12 and the CCD shift registers 10 through the clock interconnects 16, in known fashion. The clocking circuitry 11 provides a number of output signals as indicated in FIG. 7A, including a four-phase clocks $0_1$ through $0_4$. These various signals are shown and discussed in relation to FIGS. 10A through 10J.

The CCD shift register 10 includes a plurality of stages through which the charge packets are propagated under control of the clocking signals, those stages being shown as 14-1, 14-2, . . . in FIG. 7A.

FIG. 8A is a schematic cross-sectional view of the stabilized charge injector 12 and the first two stages 14-1 and 14-2 of the CCD shift register 10 of FIG. 7A. As shown, a substrate 70 of silicon (which may be an epitaxial layer on a further substrate) includes a P+ type source region 76 formed within the substrate 72 and a source contact 80 formed through a window in the silicon dioxide layer 74 and the silicon nitride layer 75, in direct contact with the region 76. Signal injection is achieved primarily through the use of the electrodes 80, 82, 84, 86 and 88, to 82, 84 and 86 of which the biasing potentials V+, $V_H$ and V— are applied. Generally, the voltage signals V+ and V— as shown in FIGS. 10C and 10D respectively, establish a charge distribution as seen in FIGS. 9A to 9D within the silicon substrate layer 70. In particular, the input signal is applied to either the V+ electrode 82 or the V— electrode 86, for the control of the injection of the charge packets into the first and subsequent wells of the CCD 10. $0_{1A}$ and $0_{1B}$ electrodes are provided to facilitate the injection of the large amounts of charge needed for the maximum allowable propagating charge packet, $Q_{MAX}$. The injected charge then is transferred successively beneath the 01, 02, 03 and 04 electrodes of the successive groups 14 to be transferred along the length of CCD 10. The various signals as applied to the electrodes of the stabilized charge injector 12 as well as the shift register portion of the CCD 10 are shown in FIGS. 10A to 10J.

Figure 9A:
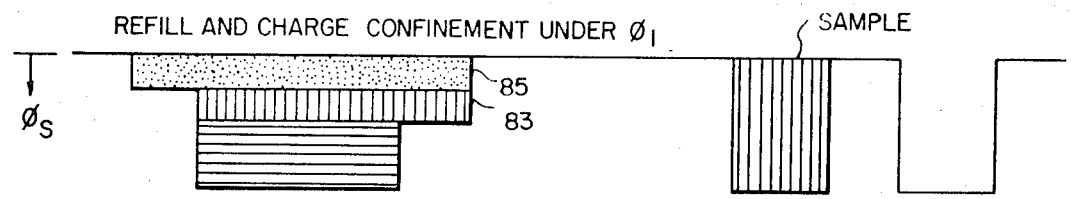

The first refill step of injecting the signal into the CCD 10 is shown in FIGS. 9A and 10A by pulsing the DIN electrode 80 to a potential near the potential of the substrate 70. During the refill phase as shown in FIG. 9A, the charge uncertainty is limited by the following equation:

$$q_n^2 = kT(C_+ + C_H + C_-) \quad (21)$$

These charge fluctuations are meaningless since in the next step as shown in FIG. 3B, the minority carriers near that charge level are drained or "scuppered" from the upper part 85 of the well established beneath the electrodes 84 and 86 back into the P+ diffusion region 76, which now is reverse-biased, until the charge level within the well 83 underneath the electrodes 84 and 86 reaches the voltage level as applied to the V+ gate electrode 82. In other words, all of the excess charges including those which give rise to the population variation or randomness as expressed in equation (21) are scuppered into the drain region 78 until the surface potential at the $V_H$ and V— electrodes 82 and 86 equals the surface potential underneath the V+ electrode, which has noise fluctuations given by the equation:

$$\overline{\Delta\phi_n^2} = kT/C_{P+} \quad (22)$$

where $C_{P+}$, $C_{P-}$ and $C_{PH}$ equal the total on-chip plus off-chip capacitances at the nodes associatee with the V+ electrode 82, the V— electrode 86 and the $V_H$ electrode 84, respectively.

Figure 9B:
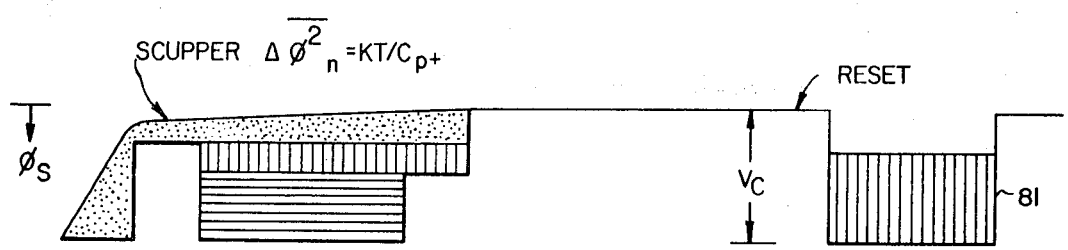

As seen in FIGS. 8A and 10A, the source diffusion 76 is biased by the voltage applied to the electrode 80, whereby all the minority carriers near the charge level as given in the equation (3) within the well formed beneath the electodes 82, 84 and 86 as shown in FIG. 9B, are drained or scuppered back into the diffusion region 76. At the end of the scupper process, the excess or random charges have been removed from this uppermost part 85 of the well beneath the electrodes 82, 84 and 86.

Next, the injection gate is enabled by applying a negative-going inject pulse IG as shown in FIG. 10B to the injection gate electrode 88, whereby positive charges are permitted to flow into the first receiving well 89 beneath the IG electrode 88, the $0_{1A}$ electrode 90 and $0_{1B}$ electrode 91, and $0_1$ electrode 92-1. The minority carriers continue to flow until the surface potential beneath the electrode V— (86), which has a potential noise fluctuation in accordance with the equation:

$$\overline{\Delta\phi_n^2} = kT/C_{P-} \quad (23)$$

Electrode 84 may be electrically connected to electrode 86 or an independent negative voltage may be applied to electrode 84 to establish as depletion region which acts as a minority carrier holding well 93. During this injection period, any potential fluctuation on the $V_H$ electrode 84 injects undesired charge randomness given by the equation:

$$q_n = C_H \cdot \Delta\phi_n, \text{ where } \overline{\Delta\phi_n^2} = kT/C_{PH} \quad (24)$$

Figure 9C:
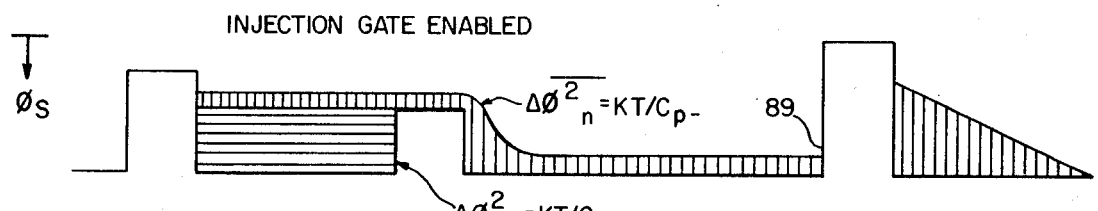
Figure 9D:
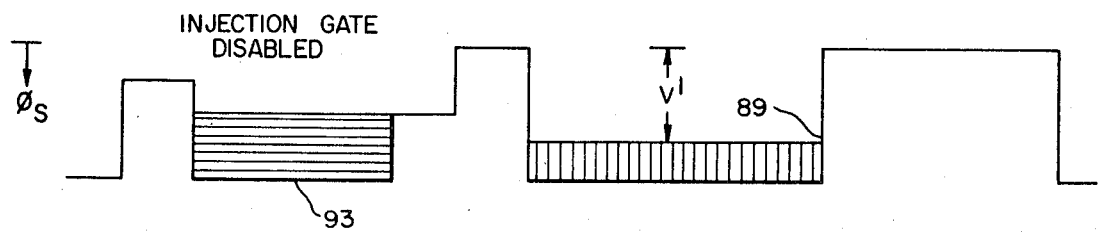

The input signal as shown in FIG. 10D may be applied to either the V+ electrode 82 or the V— electrode 86 whereby the quantity of charges permitted to flow into the well 89 is controlled as shown in FIG. 9C. Further, equations (22), (23) and (24) as given above may be expressed as follows:

$$Q_{SIG} = (C_H + C_-)(V_+ - V_-) \quad (25)$$

and $q_n^2 = (C_H + C_-)^2 \cdot (kT/C_{P+}) + (C_H + C_-)^2 \cdot (kT/C_{P-}) + (8) C_H^2 \cdot (kT/C_{PH})$ or $$q_n^2 \simeq (C_H + C_-)^2 kT \cdot (C_{P+}^{-1} + C_{P-}^{-1} + C_{PH}^{-1}) \quad (26)$$

The last factor of equation (26) is simply the equivalent series combination of the total off-chip parasitic and on-chip capcitance at the V+ electrode 82, $V_H$ electrode 84 and V— electrode 86, which may be expressed by the term $C_P$, permitting the following equation:

$$q_n = (C_H + C_-) \cdot (kT/C_P)^{\frac{1}{2}} \quad (27)$$

In FIG. 8A there is shown electrodes $0_{1A}$ and $0_{1B}$ 90 and 91 which facilitate the injection of large amounts of charge into the well 89 therebeneath to permit the maximum allowable propagating charge packet $Q_{MAX}$. As seen in FIGS. 10E and 10F, negative-going pulses are applied to the electrodes 90 and 91 during the injection step, whereby a maximum amount of charges are disposed in the well 89. If $V_C$ denotes the surface potential differences generated by the clock signals $0_1$ to $0_4$ and $V^1$ indicates the surface potential when $Q_{MAX}$ is disposed within the region 89 underneath electrodes 91 and 92, the following relationship is obtained:

$$Q_{MAX} = C_1 \cdot V_C = (C_H + C_-)(V_+ - V_-) = (C_{1A}+C_1) \cdot (V_C - V^1) \quad (29)$$

In the final step of operation as shown in FIG. 3D, the injection gate is disabled when the injection gate signal as shown in FIG. 10B returns to a more positive level, thereby raising a barrier across which the charges do not flow back into the holding well 93 beneath the electrode 84; if the charges were permitted to flow back, an extra uncertainty would be introduced into the signal processing. The barrier potential must rise slowly compared to the speed of charge flow forward into the receiving well 89. The help this forward flow of charges, the effective drain potential $V^1$, must be kept sufficiently below the effective source potential $V-$ to provide the desired longitudinal drift fields for moving the charge forward in accordance with the following equation:

$$(V_+ - V_-) - V^1 > V_{MIN} \quad (30)$$

From equations (29) and (30), the capacitances are selected and thereby the area of the corresponding electrodes in the formation of the integrated circuit.

From equations (25) and (29), it is seen that the amount of charge injected is linearly related to the input signal voltage $V-$ as shown in FIG. 10D by the factor of the capacitances $(C_H + C-)$. Since these capacitances are essentially determined by the characteristics of the silicon dioxide layers 74 and the silicon nitride layer 75, they are independent of the charge storage potential applied, giving the desired signal-voltage-to-injected-charge linearity to thereby meet one of the requirements for DASP. (See FIG. 8B, schematically showing the input capacitances).

After the charge packet has been transferred into the well beneath the $0_1$ electrode 9201 of the first cell 14-1, the charge packet is transferred from well to well along the linear length of the CCD 10 under control of the phase clock signals $0_1$, $0_2$, $0_3$ and $0_4$, as shown respectively in FIGS. 10G to 19J. It is understood that the $0_1$, $0_2$, $0_3$ and $0_4$ clock signals are applied to the corresponding electrodes 92, 94, 96 and 98 of each of cells 14 of the CCD 10. Generally, the charge packet is transferred from well to well by an attractive voltage (shown in the waveforms of FIGS. 10G to 10J as a relatively low amplitude) applied to the next electrode, and thereafter applying a repulsive voltage (shown in the voltage waveforms as a relatively high amplitude) to the well from which the minority charge carriers are attracted. The transfer of the charge carriers from well to well is generally shown in FIGS. 10G to 10J by arrows indicating that the carriers are transferred from well to well by successive application of attractive voltages ($0_1$ to $0_4$) to the corresponding successive electrodes; the charge packet is further transferred from the well underneath the $0_4$ electrode of one stage 14 to the well beneath the $0_1$ electrode of the next, successive stage 14.

EXTENDED CORRELATED DOUBLE SAMPLING (ECDS)

From the foregoing discussion of charge propagation in a CCD, it will be appreciated that certain sources of noise and/or errors in the output charge packet exist. These include non-uniformities of threshold and leakage current conditions within the successive wells of the CCD channel through which the charge packet propagates, and also bias errors such as may occur from drifting of the biasing sources. Compensation of these sources of error must be provided to achieve desired linearity and accuracy. The technique of the present invention provides the necessary correction for these errors. The technique is termed hereinafter ECDS, for "Extended Correlated Double Sampling". In general, ECDS provides for alternately injecting samples of the input signal and a reference level signal whereby the successive signal samples, or charge packets, are separated by the reference level signals, or charge packets. The reference level signals may be visualized as affording sample-to-sample isolation; equally valid is the visualization of same as affording isolation cells surrounding each signal cell. The reference signal level need not be alternated with all of the data sample signals, if reduced sample-to-sample isolation is acceptable, thus permitting only one reference signal for every predetermined number of signal samples instead to be employed. The following discussion, however, assumes that alternate reference and signal samples are propagated down the CCD channel.

The only requirement on any auxiliary signal, i.e., the reference signal, carried in the isolation cells is that it not contribute a varying amount of charge to the succeeding data-carrying stages, which then becomes indistinguishable from the desired data. Any DC reference level fulfills that requirement, but a specially useful DC reference corresponds to the AC zero signal level. In this case, both the reference AC zero and the analog signal with reference bias appear sequentially interleaved at the CCD output.

Differencing the "reference only" and "signal plus reference" levels via the "clamp-sample-hold" technique of "extended correlated double sampling" (ECDS) then yields the desired error correction. Since both the "reference only" and "signal plus reference" sample follow the same path, they both interact with the same electrodes and thus give outputs determined by the same set of threshold voltages. Therefore output subtraction cancels any effects of MOS threshold non-uniformities and biasing errors with reduced sensitivity to leakage current non-uniformities. For applications where both samples dwell equally long at every point along their path, the leakage change accumulated in both samples is identical and cancels exactly when the two samples are differenced at the output.

When the alternate reference level and signal level samples are employed, the sample-to-sample isolation above noted affords a further significant advantage in the reduction of crosstalk between successive signal samples. Specifically, the sample-to-sample isolation, E, as referred to the CCD, may be defined by the relative signal content of a CCD output charge packet:

$$\epsilon = \frac{\text{charge remaining from original signal sample}}{\text{charge added from preceding signal charge packets}}$$

Thus, $\epsilon$ is a measure of the extent to which one signal charge packet remains free from charge contributions from preceding signal charge packets corresponding to other independent samples of the signal. (The related phenomenon of crosstalk between signal samples occurs when a parallel in/serial out (PI/SO) CCD is used in a multiplexer.) Inadequate sample-to-sample isolation most generally results in degraded signal processing performance.

Figure 7B:
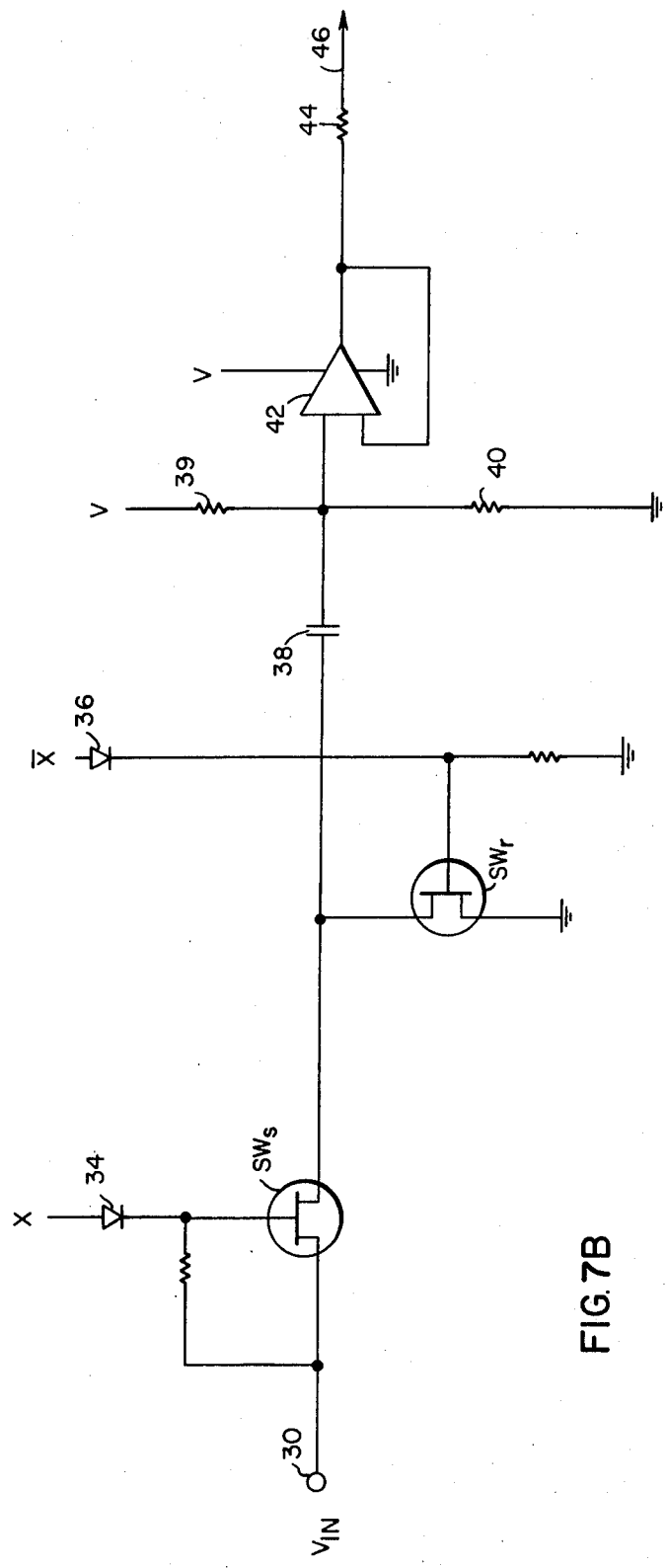

An illustrative implementation of ECDS is shown in FIGS. 7A and 7B and will be explained with reference to the waveforms of FIGS. 10K through 10O. In FIG. 7A, multiplexer 199 alternately samples the data signal labelled "V input signal," and the reference signal labelled "V reference level signal" and supplies alternate samples thereof to the stabilized charge injector 12.

An illustrative implementation of the multiplexer 199 is shown in FIG. 7B; it is to be understood that the circuit elements of FIG. 7B may be provided in a monolithic structure with the CCD 10 and other elements shown in FIG. 7A.

In FIG. 7B, the V input signal is applied to the input signal node 30 and the V reference level signal is derived from the DC potential shown as a ground terminal. Transistor $SW_S$ is the signal sampling switch and transistor $SW_R$ is the reference level sampling switch, these transistor switches respectively being rendered conductive in alternate time intervals by the multiplexing signals X and $\overline{X}$ applied thereto through diode couplers 34 and 36. As noted, signals X and $\overline{X}$ are alternately enabling for their respective transistors so as to provide alternate signal and reference level signal samples. The samples are coupled through capacitor 38 and applied through biasing resistor divider 39, 40 to an input of an operational amplifier 42. Resistor 44 then receives the output of the amplifier 42 so as to apply these alternately selected signal and reference level signal samples to output line 46 which corresponds to the output from multiplexer 199 to the input of stabilized charge injector 12 in FIG. 7A.

The CCD 10 in FIG. 7A is shown having parallel outputs 100-2, 100-4, . . . 100-K, . . . extending from alternate stages of the shift register 10 and, specifically, 14-2, 14-4, and 14-K. Output circuits 20-2, 20-4, and 20-K, respectively, receive the alternate input and reference level signals in successive time intervals as they appear at the outputs from the stages 14-2, 14-4, . . . . Transfer function circuits 22-2, 22-4, and 22-K receive the outputs from the corresponding output circuits and generate a prescribed output versus input. Differential outputs (shown as + and −) of the circuits may be supplied in common to summing busses 23 (+) and 23 (−), as indicated; or alternatively, a single-sided (non-differential) may be connected to a single summing bus.

Also shown in FIG. 7A is a so-called analog reconstruction circuit 32. As will be subsequently become clear, this circuit has the capability both of functioning to provide ECDS in accordance with the invention and in a manner compatible therewith, to provide CDS in a manner provided by the teachings of U.S. Pat. No. 3,781,574. To assist in visualizing the components of the circuit 32, (32a) comprises a differential input circuit for receiving the summed differential outputs of the circuit 22; portion 32b includes circuit elements for implementing CDS in accordance with U.S. Pat. No. 3,781,574, and section 32c comprises the ECDS portion of the circuit 32.

Rather than having two summed signals ($\Sigma(+)$) and ($\Sigma(-)$), each of the parallel outputs 100-2, 100-4, . . . from CCD 10 may be processed separately and specifically by a corresponding circuit 32. Also, a serial output from CCD 50 may be derived and processed by a single circuit 32. For parallel readout, non-destructive sensing of course is implied for most cases, whereas serial readout normally is destructive.

The operation of the circuit 32 will be more readily understood with reference to the waveforms of FIGS. 10K through 10O. FIG. 10K shows the alternate signal level and reference level charge packet distributions and their relative amplitudes. For the moment, both the signal and reference levels will be treated as signals for purposes of explaining the CDS circuit function.

As seen in FIGS. 10G through 10J, 4-phase clocking of the gate electrodes is employed. Moreover, the waveforms in the foregoing discussion assume that gate electrode $0_1$ is the sensor electrode. It furthermore is assumed for the parallel output shown in FIG. 7A that non-destructive sensing is being performed. Examples of suitable non-destructive sensing techniques are set forth hereinafter.

For the charge packet propagation shown in FIGS. 10G through 10J, it is seen that $0_1$ goes high or repulsive and, after $0_2$ goes high or repulsive (thereby isolating the $0_1$ electrode) $0_1$ again goes low or attractive. $0_4$ at this instant, however, is high or repulsive and hence the charge packet is confined under the $0_3$ electrode by both $0_2$ and $0_4$ being high. Moreover, the $0_1$ electrode well, though attractive, now is isolated from the charge being propagated and a reference level sensed from the $0_1$ electrode will be indicative of that condition. From FIG. 10L, a first clamp signal now is generated to clamp the voltage of a memory capacitor to the current $0_1$ level. The voltage developed in the memory capacitor will include the Nyquist noise from the sampling, or clamping function.

The charge subsequently propagates from $0_3$ to $0_1$: due to $0_4$ becoming attractive and $0_3$ going repulsive followed by $0_4$ going repulsive with $0_2$ also repulsive to confine the charge packet under the $0_1$ gate electrode. Under this circumstance, the maximum charge packet is confined under the $0_1$ electrode - the appropriate time for sampling of that signal level. Accordingly, and as seen in FIG. 10M a sample voltage pulse is generated for sampling the potential level of the $0_1$ electrode during this interval (i.e., while the maximum charge is confined under $0_1$). The signal sample then is compared in amplitude with the clamped voltage sensed from the $0_1$ electrode in the earlier interval when the $0_1$ electrode was isolated from the propagating charge package, and a difference signal is generated. Since Nyquist noise associated with the output reset operation is stored and remains essentially unchanged through the sample operation, the result difference then provides an output signal level which represents the true signal level, independent of the Nyquist noise.

FIG. 10K illustrates the charge distribution levels under the $0_1$ electrode for the signal pattern of alternate signal and reference level samples, in accordance with ECDS. As noted, the reference level conveniently is AC zero. Accordingly, the sampling function performed in accordance with the sampling waveform of FIG. 10F provides alternate signal level and reference level samples. The reference sampled in a first shift cycle of the CCD readout is stored on a memory capacitor and compared during the next cycle with the signal level sample. The difference therebetween then is taken as the output signal level sample from the CCD. It should be appreciated in this context that the Nyquist noise rejection is accomplished within each shift cycle of the CCD (i.e. as defined by the completed cycle of $0_1$ through $0_4$ for shifting a charge packet through and from one stage and into the next). Hence, each of the reference level sample and the signal level sample are corrected individually for the Nyquist noise error by the CDS technique.

The significance of ECDS will be readily appreciated when it is realized that each of the reference level and signal level samples propagates through the identical paths of the CCD. Hence, for a serial input charge injection as shown in FIG. 7A, each charge packet — both reference and signal — has the same residence time in each successive stage of the CCD shift register 10 and each is subjected to the same non-uniformities of threshold levels and leakage current and bias variations. The differencing of the reference and signal level samples of two successive cycles provides for elimination from the final output signal sample of errors occurring due to threshold and leakage current non-uniformities and bias level variations. Thus, full and complete correction for these sources of error is achieved by ECDS. Moreover, ECDS is fully compatible with CDS. The distinction of ECDS correcting for errors from the input to the output of the CCD as contrasted to CDS correcting only for Nyquist noise sampling at the output of any form of analog charge output device, as well, will be readily seen.

Referring again to the analog reconstruction circuit 32 of FIG. 7A, portion 32a comprises a differential input responsive to the differential outputs of the circuits 22 (from the summed input busses 23 thereof), portion 32b performs the CDS function for Nyquist noise cancellation in accordance with the teachings of U.S. Pat. No. 3,781,574, and portion 32c performs the ECDS function.

The differential outputs of circuits 22 from the busses 23, summed and of the relative polarities indicated, are applied to the operational amplifiers 140 and 142 and the differential output thereof is supplied through a further operational amplifier 146 which may serve as a buffer. Single-sided (non-differential) outputs from the function transfer circuits 22 applied to a single summing bus require only a single summing point operation amplifier in lieu of the differential scheme illustrated in circuit portion 32a.

In the CDS section 32b, switch 152 receives the first clamp signal of FIG. 10L at its input terminal 151. When the first clamp is low, switch 152 is open. At the (high) time of the first clamp, switch 152 closes to apply the DC signal bias level $V_C$ to capacitor 148. The potential on the $0_1$ electrode, which at this time is isolated from the charge packet, is sensed and the output thereof supplied across the bias established on capacitor 148 to operational amplifier 150. Note in this regard that the signal which is coupled to and stored across capacitor 148 represents the Nyquist noise resulting from this sampling function, since $0_1$ currently is isolated from the charge packet (see FIGS. 10G through 10J).

Switch 160 receives the "first sample" signal waveform of FIG. 10M and, accordingly, opens switch 160 to sample the signal level then on electrode, $0_1$. For the combined ECDS/CDS system here under consideration, and comparing FIG. 10M with FIG. 10K, the first sample will be of a reference level. That sampled reference level is coupled through capacitor 148 and thus differenced with the Nyquist and bias ($V_c$) value signal stored on capacitor 148, and then is supplied through amplifier 150 to switch 160, corrected for the Nyquist sampling error. Switch 160 receives the "first sample" signal waveform of FIG. 10M, and supplies the Nyquist-correct reference level sample to the common node of memory capacitor 161, for storage thereon, and to the input of operational amplifier 162. The described CDS clamping and sampling operations repeat for each transfer cycle as seen in FIGS. 10L and 10M. Accordingly, the Nyquist noise level is again established on capacitor 148 and upon sampling of the signal level of FIG. 10K (i.e., in the next transfer cycle) the Nyquist noise-corrected, sampled signal level is coupled through operational amplifier 150 to switch 160. Again, switch 160 is closed by the "first sample" pulse waveform of FIG. 10M and the Nyquist-corrected signal level sample is stored on the storage capacitor 161.

Simultaneously with the next "first clamp" (FIG. 10L) following a reference level sampling, the second reference level clamp (FIG. 10N) occurs; the "second reference clamp" is applied to terminal 171 of switch 172 to close same. A circuit thus is completed to transfer the voltage stored on capacitor 161 (i.e., the reference level voltage) to capacitor 168 for storage thereon.

Switch 180 now receives and is closed by the (AC) true signal sample waveform of FIG. 10O (occuring in the alternate cycles of the second reference clamp of FIG. 10N to complete a circuit from the storage capacitor 161 through amplifier 162, capacitor 168, and amplifier 170 to storage capacitor 183. The signal sample level on capacitor 161 thus is differenced against the reference level stored on capacitor 168 and the difference signal value stored on storage capacitor 183. Hence, operational amplifier 182 provides an output signal corrected both in accordance with CDS and ECDS.

The foregoing accordingly teaches technique and circuitry for non-destructive, buffered, independent readout of charge transfer devices which has been termed herein a floating clock sensor technique. Various specific implementations of the invention have been disclosed, including a teaching of providing the necessary control circuitry for this technique of the invention in a monolithic structure. The monolithic structure moreover permits implementation of the circuitry with bipolar transistor structures or I²L technology, highly desirable in view of its extremely high speeds of operation. The preferred implementation of the floating clock sensor technique of the invention includes use of ECDS and also CDS, if desired. Circuits for these implementations have been disclosed. The invention is useable with both parallel and serial outputs from charge transfer devices and, for example, would be useful in the parallel output mode for a wide range of applications, such as correlators, transversal filters, and the like.

Accordingly, it is clear that numerous adaptations and modifications of the invention will be apparent to those of skill in the art and hence it is intended by the appended claims to cover all such modifications and adaptations as fall within the true spirit and scope of this invention.

What is claimed is:

1. A system for providing non-destructive readout from a charge transfer device wherein said charge transfer device includes plural stages each defined by a corresponding group of plural electrodes and at least one of said stages comprises an output stage wherein one of said group of plural electrodes thereof comprises a predetermined sensor electrode in which a voltage is induced by a charge packet propagating through the corresponding stage, comprising:

control means for supplying clocking signals to respective ones of said plural electrodes of each of said stages to shift a charge packet through the successive stages of said charge transfer device at a predetermined cyclic shift rate, and defining in each shift cycle thereof a succession of reset, clamp, mux, and sample intervals in relation to the said clocking signals, said control means generating a reset signal in timed relation to said clocking signals for defining said reset interval, switching means connected to the said predetermined sensor electrode and to said control means for receiving the clocking signal associated with said sensor electrode, said switching means normally being open so as to isolate said sensor electrode from said clocking signal and said control means, said switching means being rendered conductive in response to said reset signal, for applying said corresponding clocking signal to said sensor electrode to render the latter repulsive and then attractive during said reset interval, said control means applying corresponding clocking signals to others of said group of electrodes of said output stage during said reset interval to isolate said sensor electrode from charge packets propagating through said charge transfer device prior to said sensor electrode clocking signal rendering said sensor electrode attractive during said reset interval, said control means terminating said reset signal and opening said switching means thereby to isolate said sensor electrode from said clocking signal and said control means, said sensor electrode maintaining said attractive potential condition thereof, during said clamp, mux, and sample intervals, said corresponding clocking signals applied to others of said electrodes of said group advancing a charge packet to the potential well of said sensor electrode during said mux interval and confining said charge packet therein during said sample interval, means connected to said sensor electrode for sampling the potential induced therein by the charge packet retained in the potential well thereof during said sample interval and producing an output signal sample representative thereof, and said sample interval terminating prior to a next successive reset interval.

2. A non-destructive readout system as recited in claim 1 wherein there is further provided means responsive to the output signal produced by said sampling means during said clamp interval for storing a value corresponding thereto and responsive to the output signal of said sampling means produced during said sample interval for differencing the sample interval output signal with said clamp output signal and providing the difference thereof as the output signal sensed from said charge transfer device.

3. A system as recited in claim 2 wherein said differencing means corrects for Nyquist noise in the sampling operation by differencing said output signal with said clamp output signal, each thereof including corresponding components of Nyquist noise.

4. A non-destructive sensing system as recited in claim 1 wherein:

said switching means comprises a first transistor having a control input connected between the drain and source thereof for receiving said reset signal, said drain being connected to said sensor electrode and said source being connected to said corresponding clock output of said control means, and said sampling means comprises a first pair of series-connected transistors having the control input of a first one of said pair connected to said sensor electrode, and a further transistor, the control input thereof being connected to the series connection of said pair of series connected transistors, the output of said further transistor comprising the output signal corresponding to the potential condition of said sensor electrode.

5. A non-destructive readout system as recited in claim 4 wherein:

said series connected transistors comprise MOS transistors and said further transistor comprises a vertical bipolar transistor, and each of said transistors is formed in a common monolithic structure with said charge transfer device.

6. A non-destructive readout system as recited in claim 5 wherein said series connected transistors comprise MOS transistors connected in an inverter configuration.

7. A non-destructive readout system as recited in claim 6 wherein said series connected transistors comprise MOS transistors connected in an emitter-follower configuration.

8. A system as recited in claim 1, further comprising:
a source of an input signal and of a reference level signal, means for selectively and sequentially sampling said reference level and input signals in a prescribed sequence and at said cyclic shift rate, means responsive to said sequence of reference and signal samples for injecting corresponding charge packets into said charge transfer device at an input stage thereof at said cyclic shift rate and thus corresponding to the rate of shifting of charge packets to successive stages of said charge transfer device, said sampling means producing reference level and signal output samples in said prescribed sequence, and analog circuit means for selectively responding to the reference and signal output samples of said prescribed sequence for determining the difference in value therebetween and producing an output indicative of the difference as the output signal from the charge transfer device.

9. A non-destructive readout system as recited in claim 8 wherein there is further provided means responsive to the output signal produced by said sampling means during said clamp interval for storing a value corresponding thereto and responsive to the output signal of said sampling means produced during said sample interval for differencing the sample interval output signal with said clamp output signal and providing the difference thereof as the output signal sensed from said charge transfer device.

10. A system as recited in claim 1 wherein said input sampling means alternately samples the reference level and input signals in sequence, for supplying said reference level and input signal samples, as a related pair, into said input stage of said charge transfer device.

11. A system as recited in claim 10 wherein said charge transfer device comprises a CCD shift register including a plurality of stages, each stage including a plurality of electrodes for each stage, and
clocking means providing a sequence of clocking signals to said electrodes of each stage for successively shifting a charge packet through each said stage and to a successive stage at said cycle rate.

12. A system as recited in claim 11 wherein the clocking means defines a clamping interval and a sensing interval in accordance with the sequence of clocking signals provided in each shift cycle, and wherein:
said sampling means samples the potential of a preselected one of said plural electrodes of said output stage, and is controlled by said clocking means to produce a clamp output during said clamp interval and a sample output during said sample interval, and
said analog circuit means includes storage means for storing the value of said clamp output from said preselected electrode of said output stage during said clamping interval and for storing the signal sample output from said predetermined electrode during said sampling interval, and means for determining the difference between the clamped output stored in said external memory means and said signal level output to provide the difference therebetween as the output signal of said system, thereby removing components of noise from said sample output, contributed by said sampling function.

13. A system as recited in claim 12 wherein said sample output during said sampling interval in a first shift cycle comprises a reference level sample and the sample output in a next successive shift cycle comprises a signal sample, the output signal of said analog processing circuit thereby comprising the difference between the noise corrected output sample for said reference signal and the noise corrected output sample for said signal sample, to correct for both the effects of noise due to the sampling function and errors due to nonuniformities of threshold and leakage currents of said charge transfer device and said input and output circuitry in producing said output signal.

14. A system for providing non-destructive readout from a charge transfer device wherein said charge transfer device includes plural stages each of which have plural electrodes and at least one of said stages comprises an output stage wherein one of said plural electrodes thereof comprises a sensor electrode in which a voltage is induced by the charge packet propagating through the corresponding stage, comprising:
control means providing clocking signals to respective ones of said plural electrodes of each of said stages to shift a charge packet through the successive stages of said charge transfer device at a predetermined cyclic shift rate, and defining in each cycle thereof a succession of reset, clamp, mux, and sample intervals in relation to the said clocking signals, said control means generating a reset signal in timed relation to said clocking signals for defining said reset interval;
switching means connected to the said sensor electrode and to said control means for receiving the clocking signal associated with said sensor electrode, said switching means normally being open so as to isolate said sensor electrode from said clocking signal and said control means;
said control means supplying said reset signal to said switching means to close same for applying an associated clocking voltage to said sensor electrode, said clocking signals driving said sensor electrode repulsive to advance any charge packet to a successive electrode and subsequently isolating any charge packets from said sensor electrode by application of repulsive clocking potentials to electrodes next preceding and next succeeding said sensor electrode and thereafter rendering said sensor electrode attractive during said reset interval, said reset signal then terminating to open said switching means for disconnecting said sensor electrode from said clocking signal associated therewith and said control means and defining a succeeding clamp interval, said clocking signals applied to said electrodes then defining a mux interval during which the next preceding clock electrode is rendered first attractive and then repulsive to advance the charge packet into said sensor electrode and isolate same under said sensor electrode while said succeeding electrode clock potential maintains said succeeding electrode repulsive and defining thereby a sample interval, said control means supplying a clocking potential to said succeeding electrode to attract the charge packet therefrom to conclude the sample interval, prior to generation of the aforesaid reset control signal for repeating the cycle as aforesaid, and
non-destructive sensing means connected to said sensor electrode for sensing the potential of said sensor electrode and providing an output signal indicative of the sensor electrode potential at least during said clamp and sample intervals and thus while said sensor electrode is isolated from said control means by said switching means being open under control of said reset signal.

15. A system for providing independently buffered, non-destructive parallel outputs from a charge transfer device having a plurality of successive stages and means for injecting a charge packet into an input stage of said charge transfer device for propagation in successive shift cycles through said successive stages thereof, each said stage of said charge transfer device including a plurality of electrodes, at least selected ones of said stages including as one of said plurality of electrodes a floating clock sensor electrode, comprising:
a source of an input signal to be supplied to said charge transfer device and a source of a reference level signal,
means for alternately selecting samples of said input signal and said reference level signal and supplying in alternating succession a reference level signal sample and an input signal sample at the time rate of said cyclic shifting of charge packets through said charge transfer device,
said charge injecting means receiving said alternating succession of reference and input signal samples for injecting corresponding charge packets into said charge transfer device for propagation therethrough,
plural non-destructive sensing circuits associated with successive, alternate stages of said charge transfer device for sensing the voltage induced on a sensor electrode of the group thereof associated with said sensor device and producing an output in accordance with the charge packet currently propagating through said stage, each thereof comprising:

control means for supplying clocking signals to respective ones of said plural electrodes of each of said stages to shift a charge packet through the successive stages of said charge transfer device at a predetermined cyclic shift rate, and defining in each shift cycle thereof a succession of reset, clamp, mux, and sample intervals in relation to the said clocking signals, said control means generating a reset signal in timed relation to said clocking signals for defining said reset interval, switching means connected to the said predetermined sensor electrode and to said control means for receiving the clocking signal associated with said sensor electrode, said switching means normally being open so as to isolate said sensor electrode from said clocking signal and said control means, said switching means being rendered conductive in response to said reset signal, for applying said corresponding clocking signal to said sensor electrode to render the latter repulsive and then attractive during said reset interval, said control means applying corresponding clocking signals to others of said group of electrodes of said output stage during said reset interval to isolate said sensor electrode from charge packets propagating through said charge transfer device prior to said sensor electrode clocking signal rendering said sensor electrode attractive during said reset interval, said contol means terminating said reset signal and opening said switching means thereby to isolate said sensor electrode from said clocking signal and said control means, said sensor electrode maintaining said attractive potential condition thereof, during said clamp, mux, and sample intervals, said corresponding clocking signals applied to others of said electrodes of said group advancing a charge packet to the potential well of said sensor electrode during said mux interval and confining said charge packet therein during said sample interval, means connected to said sensor electrode for sampling the potential induced therein by the charge packet retained in the potential well thereof during said sample interval and producing an output signal sample reprsentative thereof, said sample interval terminating prior to a next successive reset interval, and analog circuit means selectively responsive to an output signal samples from said sensor means produced by sensing of a charge packet corresponding to a reference level sample to store the corresponding sensor output voltage, and selectively responsive to the output sensor voltage produced by propagation of a charge packet corresponding to an input signal sample to determine the difference between the said reference and input signal samples and to supply the said difference therebetween as the output voltage of said charge transfer device, compensated thereby for threshold and leakage current non-uniformities of said system.

16. A method of non-destructive readout from a charge transfer device wherein said charge transfer device includes plural stages each defined by a corresponding group of plural electrodes and at least one of said stages comprises an output stage wherein one of said group of plural electrodes thereof comprises a sensor electrode in which a voltage is induced by the charge packet propagating through the corresponding stage, comprising:

supplying clocking signals to respective ones of said plural electrodes of each of said stages to shift a charge packet through the successive stages of said charge transfer device at a predetermined cyclic shift rate, and defining in each shift cycle thereof a succession of reset, clamp, mux, and sample intervals in relation to the clocking signals, rendering said sensor electrode repulsive during the first portion of the reset interval to such charge packets from the vicinity thereof and then isolating said sensor electrode from charge packets by rendering the preceding and succeeding electrodes repulsive to charge packets, then rendering said sensor electrode attractive and then isolating said sensor electrode from any clocking source, and maintaining said sensor electrode isolated during a clamping interval, advancing a charge packet to said sensor electrode during the mux interval and confining the charge packet in a potential well of the sensor electrode by rendering the preceding and succeeding sensor electrodes repulsive to initiate a sample interval for sensing the potential induced in said sensor electrode by the presence of said charge packet, and terminating said sample and rendering said successive adjacent electrode attractive to advance charges from said sensor electrode and then rendering said sensor electrode repulsive to such charges from said sensor electrode potential well upon re-initiation of the reset interval.

* * * * *